(12) United States Patent
Rajathuray et al.

(10) Patent No.: US 6,684,765 B1
(45) Date of Patent: Feb. 3, 2004

(54) UNIVERSAL SHAFT DESIGN FOR AUTOMATIC WIPING

(75) Inventors: Thiruselvan Rajathuray, Singapore (SG); Yuen Sai Po, Singapore (SG)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/718,730

(22) Filed: Nov. 22, 2000

Related U.S. Application Data

(60) Provisional application No. 60/166,810, filed on Nov. 22, 1999.

(51) Int. Cl.⁷ ............................................. B05C 17/04
(52) U.S. Cl. ........................ 101/123; 101/424; 101/425
(58) Field of Search ................................. 101/123, 423, 101/424, 425; 400/242, 243, 246, 586, 594, 611, 613, 613.1, 615; 242/571, 571.3, 571.4, 571.5, 573.1; 403/366

(56) References Cited

U.S. PATENT DOCUMENTS

| | | | |
|---|---|---|---|
| 1,918,518 A | 7/1933 | Carter | |
| 1,956,193 A | 4/1934 | Gollong | 242/46.6 |
| 2,576,254 A | 11/1951 | Fletcher | 242/130 |
| 3,018,977 A * | 1/1962 | Skallquist | 242/571.6 |
| 3,360,208 A * | 12/1967 | Winkler | 242/571.4 |
| 3,655,141 A | 4/1972 | Warthen | 242/46.4 |
| 3,756,523 A | 9/1973 | De Young | 242/46.6 |
| 3,999,721 A | 12/1976 | DuFresne | 242/68.3 |
| 4,911,376 A * | 3/1990 | Thompson | 242/573.2 |
| 4,978,082 A * | 12/1990 | Sugioka et al. | 242/573.7 |
| 5,123,606 A * | 6/1992 | Braun et al. | 242/573.7 |
| 5,297,750 A | 3/1994 | Hunt | 242/55.54 |
| 5,460,339 A * | 10/1995 | Drew | 242/572 |
| 5,492,280 A | 2/1996 | Corres | 242/130 |
| 5,626,309 A | 5/1997 | Morgan | 242/571.4 |
| 5,725,321 A | 3/1998 | Brannan et al. | 400/708 |

* cited by examiner

Primary Examiner—Ren Yan
(74) Attorney, Agent, or Firm—Mitchell K. McCarthy

(57) ABSTRACT

A cleaning element for a solder paste printing machine includes a shaft with an opening therein. Positioned within the opening is a protrusion element. A spring element is also positioned within the opening. The protrusion element further includes a first portion which fits within the opening of the shaft, and a second portion which extends beyond the opening in the shaft. At least a portion of the spring element is sandwiched between the opening in the shaft and the first portion of the protrusion element. A cover having a slot therein for allowing the second portion of the protrusion element to pass therethrough may also be provided for covering the shaft.

19 Claims, 7 Drawing Sheets

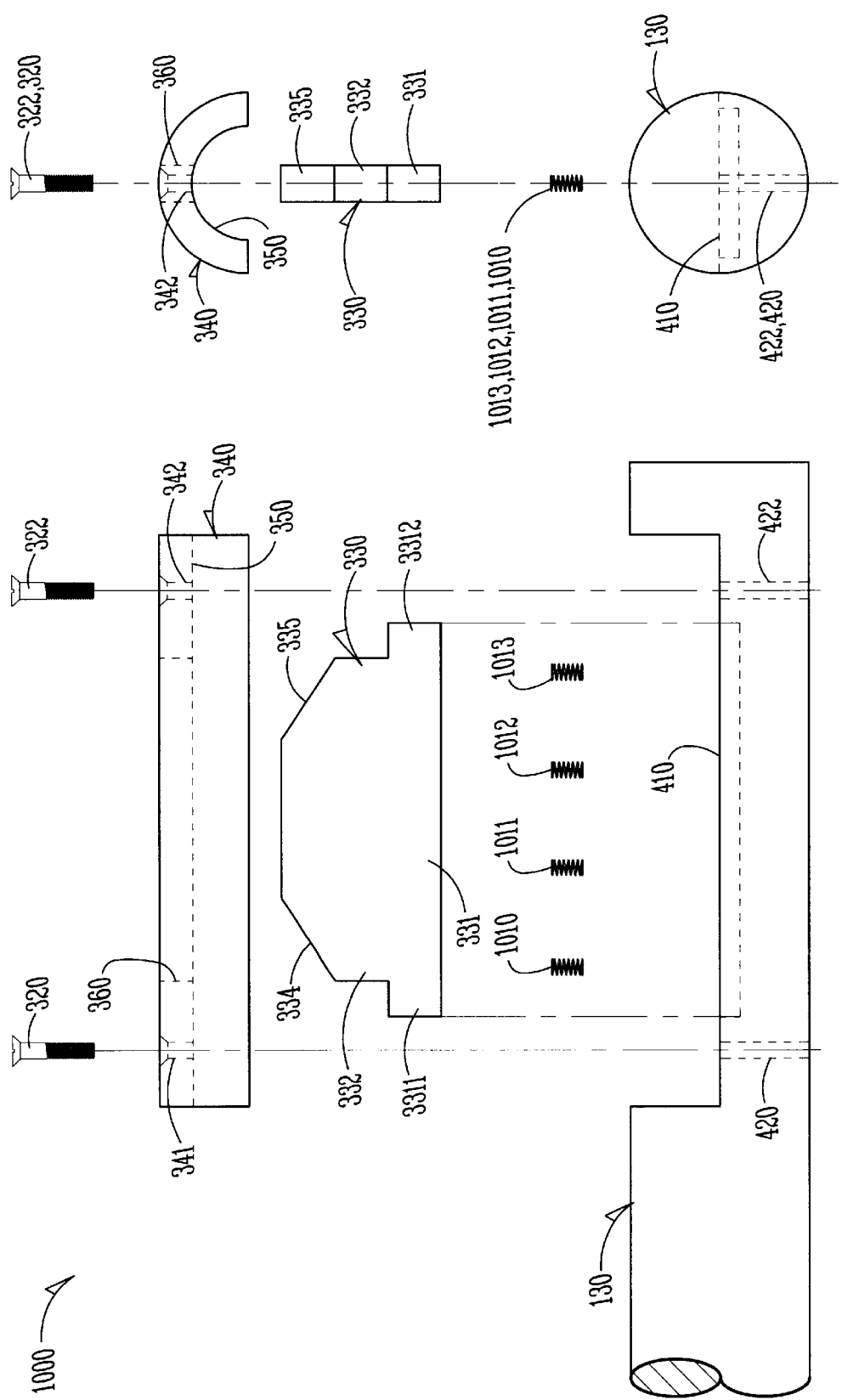

ns can vary significantly resulting in a large cost variation. This will create a high inventory on wiping paper type, as required to support the operation as necessary.

UNIVERSAL SHAFT DESIGN FOR AUTOMATIC WIPING

RELATED APPLICATION

This application claims the benefit of U.S. Provisional Application Serial No. 60/166,810, filed Nov. 22, 1999 under 35 U.S.C. 119(e).

FIELD OF THE INVENTION

The present invention relates to the field of placing soldering paste into and onto electronic circuit boards, ceramic substrates and laminate packages. More particularly, this invention deals with the periodic process of cleaning a printer bar with paper and an apparatus for carrying out this operation.

BACKGROUND OF THE INVENTION

A common structure in various electronics packages, such as laminate packages, wired circuit boards, ceramic substrates, and hybrid circuits, is a via. A via is a vertical opening filled with conducting material used to connect circuits on various layers of a device or electronics packages to one another. Vias in certain devices may connect to a semiconducting substrate. A via generally starts as an empty cylindrical opening in an electronics package. During manufacture, the via is initially filled with soldering paste. The part is soldered or placed in a solder bath resulting in the via being filled with solder, which is the conducting material of the via as defined above.

The most common way to insert the soldering paste in a via has been to use a squeegee printing method. The squeegee printing method moves a squeegee over a printed circuit board held in position on a back plate. A screen with openings therein, also known as a stencil, is placed between the printed circuit board and the squeegee. The screen or stencil prevents the solder paste from being applied to areas where it is not required.

During the printing operation, the solder paste is being dispensed through the patterned stencil onto the printed circuit board ("PCB"). The top printed surface of the PCB comes into direct contact with the underside of the stencil during the paste printing process. During contact the small gap between the underside of the stencil and the board surface may become filled with excess solder paste. The excess solder may clog the aperture in the stencil. Hence it is compulsory to clean the underside of the stencil surface periodically.

The solder paste printing machine comes with stencil underside cleaning options. Cleaning is done manually or automatically at preset intervals. The cleaning option adopts a wiping system that uses lint free paper together with some cleaning chemical.

Several manufacturers have heads designed for surface mount printing of via filling paste. These heads rely on low pressure and a material rolling effect for filling vias.

Different models of screen printing machines use different types of cleaning paper for this purpose. Different types of screen printing machines come with unique features for its applications. Therefore it is common for any PCB Assembly house to have more than one type of screen printer. However, different types of screen printer use different types of wiping paper. Though all are lint free paper, the dimensions can vary significantly resulting in a large cost variation. This will create a high inventory on wiping paper type, as required to support the operation as necessary.

Carrying many types of cleaning paper inventory results in high inventory costs as well as increased complexity in making sure that the various sizes and types of cleaning paper is stocked within the PCB assembly plant. Additional costs are also incurred since each printing machine head manufacturer may charge a premium for cleaning paper that fits a particular print head on a particular model of printing machine.

Thus, there is a need for a method and apparatus for cleaning heads that uses a single type of cleaning paper for more than one type or model of PCB printing head. This has the advantage of simplifying the inventory process and allowing a PCB assembly house to get volume pricing on cleaning paper. There is also a need for a process and apparatus which can be used to more uniformly clean the heads on PCB printers. By making the process more uniform, the process can be more closely controlled and any process errors that may occur due to cleaning errors can be more quickly isolated and corrected. There is also a need for a process which can be adapted for use on all types of heads for all types of printing machines used within a PCB assembly plant. There is also a need for a device which will lessen the possibility that contaminates will be introduced into the via filling paste.

SUMMARY OF THE INVENTION

A cleaning element for a solder paste printing machine includes a shaft with an opening therein. Positioned within the opening is a protrusion element. A spring element is also positioned within the opening. The protrusion element further includes a first portion which fits within the opening of the shaft, and a second portion which extends beyond the opening in the shaft. At least a portion of the spring element is sandwiched between the opening in the shaft and the first portion of the protrusion element. Also included is a cover for covering the shaft. The cover has a slot which allows the second portion of the protrusion element to extend beyond the main body of the shaft. The cleaning element may also include a fastener having a threaded end and an upset end. The opening in the shaft also has at least one threaded opening and the cover has a corresponding opening therein for receiving the upset end of the fastener. The amount of pressure produced by the second portion of the protrusion element can be adjusted by adjusting the distance that the fastener is threaded into the threaded opening in the shaft. The second end of the protrusion element includes at least one beveled edge and may have at least two beveled edges. In some embodiments, the spring element is an elastomeric material the thickness of which can be varied to vary the amount of force produced by the protrusion element. In addition, the spring constant of the spring element can be varied to vary the amount of force produced by the protrusion element. In some embodiments, the protrusion element is made of metal. In addition, the shaft can include a second opening therein with a second protrusion element, and a second spring element positioned within the second opening. The second protrusion element further includes a first portion which fits within the second opening of the shaft, and a second portion which extends beyond the second opening in the shaft. At least a portion of the second spring element is sandwiched between the second opening in the shaft and the first portion of the second metal protrusion element. A second cover for covering the shaft is also provided. The cover has a slot therein to allow the second portion of the second protrusion element to extend beyond the main body of the shaft.

In another embodiment, the shaft of the cleaning element for a solder paste printing machine includes a plurality of openings. The cleaning element has a plurality of protrusion elements positioned within the plurality of openings in the shaft.

A solder paste printing machine includes a print head, a screen, and a screen cleaning element. The screen cleaning element includes a first shaft having unused cleaning paper thereon, and a second shaft having used cleaning paper thereon. Each of the first shaft and the second shaft have an opening therein. Each of the first shaft and the second shaft further include a protrusion element and a spring element positioned within the opening in the shaft. Each protrusion element includes a first portion which fits within the opening of the shaft, and a second portion which extends beyond the circumference of the shaft. At least a portion of the spring element is sandwiched between the opening in the shaft and the first portion of the protrusion element. Also included is a first cover for covering the opening in the first shaft and a second cover for covering the opening in the second shaft, the first cover having a slot therein to allow the second portion of the protrusion element to extend beyond the circumference of the first shaft. The second cover also has a slot therein to allow the second portion of the protrusion element to extend beyond the circumference of the second shaft. The solder paste printing machine also includes an adjustment mechanism associated with each of the first second and the second shaft for adjusting the amount of force produced by the protrusion element associated with each of the first shaft and the second shaft. In some embodiments, the adjustment mechanism associated with each of the first shaft and the second shaft includes a fastener having a threaded end. In this embodiment, the opening in each of the first shaft and the second shaft has at least one threaded opening therein. The amount of pressure produced by the second portion of the protrusion element can be adjusted by adjusting the distance that the fastener is threaded into the threaded opening in the first shaft and the second shaft.

The second end of each of the protrusion elements associated with the first shaft and the second shaft includes at least one beveled edge or may have at least two beveled edges. The spring elements associated with the first shaft and the second shaft include an elastomeric material. In some embodiments, at least one of the first shaft and the second shaft has a plurality of protrusion elements. The number of protrusion elements used is related to the force needed to hold a roll of cleaning paper onto the shaft such that there is limited movement between the shaft and the roll of cleaning paper.

Advantageously, the method and apparatus for cleaning heads described uses a single type of cleaning paper for more than one type or model of PCB printing head and printing screen. Although one single type of cleaning paper might not be able to be used throughout a PCB assembly house, this has the advantage of lessening the amount of inventory of cleaning paper needed to be carried to use in all the PCB printing machines used in one PCB assembly house. This also simplifies the inventory ordering process, as less types of cleaning paper need to be ordered. In addition, a PCB assembly house can obtain volume pricing on cleaning paper since more of one type of paper can be ordered for each PCB printing machine. The process and apparatus can be used to more uniformly clean the screens on PCB printers since there will be less types of cleaning paper used or even a single type of cleaning paper used. By making the process more uniform, the process can be more closely controlled and any process errors that may occur due to cleaning errors can be more quickly isolated and corrected. The apparatus can be adapted for use on all types of heads for all types of printing machines used within a PCB assembly plant. The invention also lessens the sources of contaminates that could potentially be introduced into the printing process.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 10 is an exploded view of another embodiment of the clamping mechanism on one end of a universal shaft 1030.

DESCRIPTION OF THE PREFERRED EMBODIMENT

Figure 1:
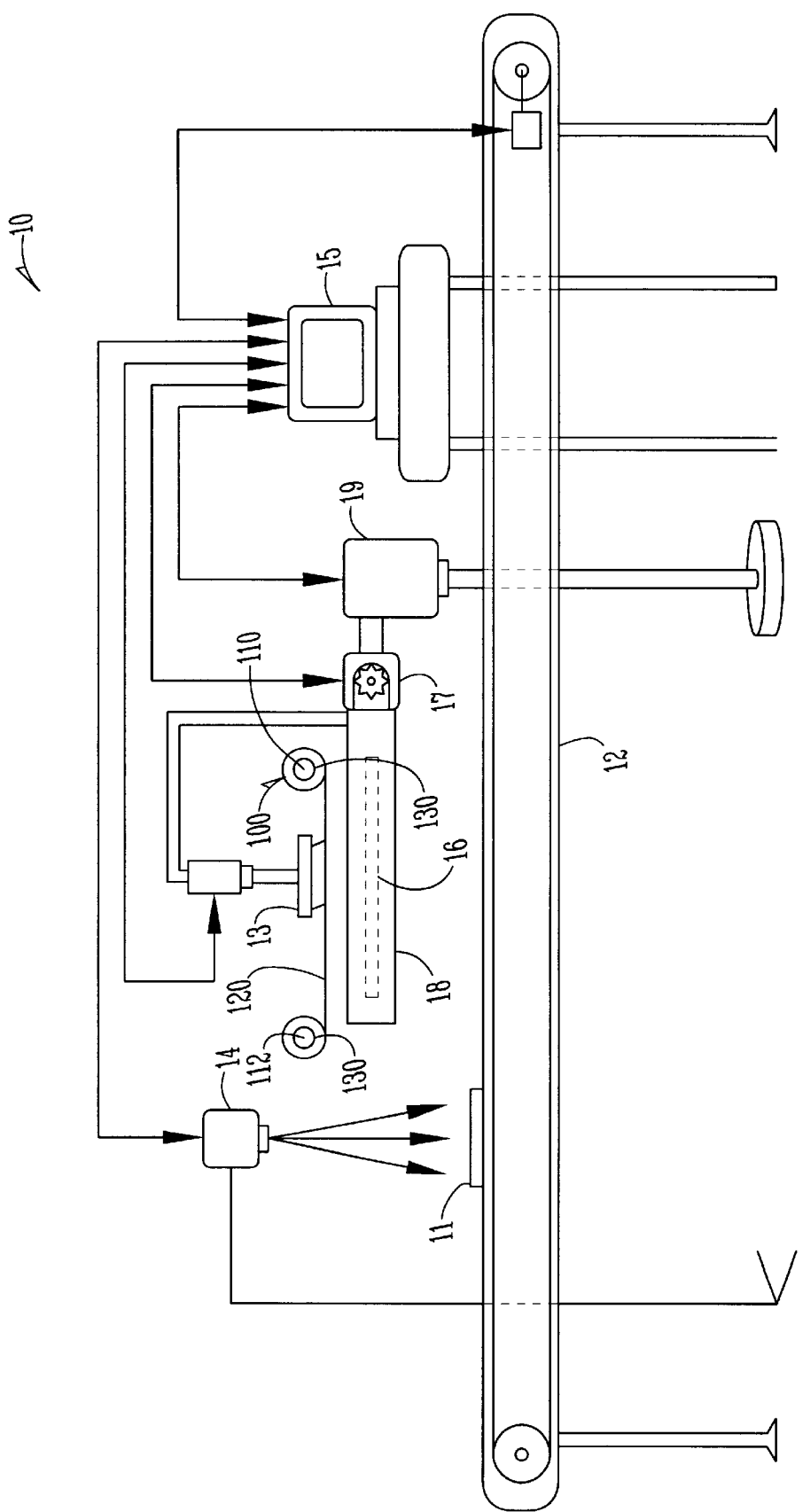
FIG. 1 is a pictorial diagram of a typical screen printer in which a preferred embodiment of the present invention is applicable.

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

The present invention is applicable to all screen-printing equipment for applying solder paste to printed circuit boards. Referring now to the drawings and, in particular, to FIG. 1, there is illustrated a pictorial diagram of typical screen-printing equipment in which a preferred embodiment of the present invention is applicable. Screen printer 10 is utilized to apply solder paste to printed circuit board 11.

This process typically begins when printed board 11 is placed on a conveyor belt 12. When directed by a control unit 15, conveyor belt 12 conveys printed circuit board 11 to a first location beneath a fixed camera 14. Camera 14 then records an image of printed circuit board 11 for subsequent transmission to control unit 15. In response to reception of the recorded image, control unit 15 directs conveyor belt 12 to shuttle printed circuit board 11 to a second location beneath a solder stencil 16. Control unit 15 further calculates the exact position of printed circuit board 11 from printed circuit board features shown in recorded image and transmits an alignment signal to a servo-motor 17. In response, servo-motor 17 makes multi-axis alignment adjustments to the position of a frame 18 in which stencil 16 is mounted. When frame 18 is aligned correctly, a pneumatic arm 19 lowers frame 18 until stencil 16 contacts printed circuit board 11, at the direction of control unit 15.

Thereafter, a squeegee blade 13 is pneumatically lowered to wipe across stencil 16, thereby pushing solder paste through stencil 16 onto printed circuit board 11. In this manner, the solder paste is selectively applied to desired areas of printed circuit board 11.

If a second type of printed circuit board (i.e., a printed circuit board having different pad locations) is to be processed, control unit 15 must be reprogrammed to calculate and transmit the correct alignment instructions to frame 18 in response to the different features of the printed circuit board of the second type shown in the recorded image. Additionally, stencil 16 corresponding to the first type of printed circuit board must be removed from frame 18 and replaced with a stencil corresponding to the second type of printed circuit board.

Figure 2:
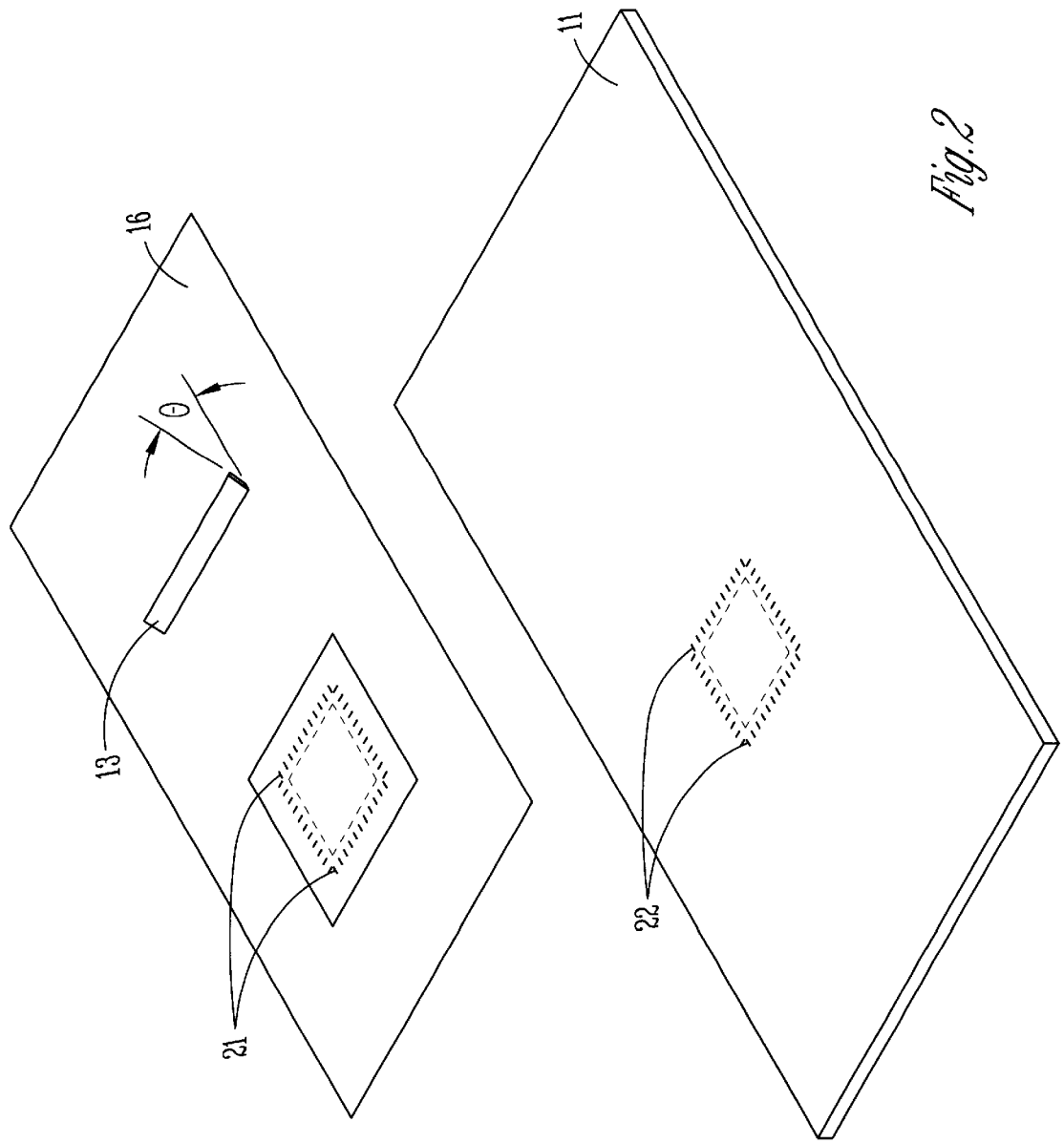
FIG. 2 is an isometric view of the stencil and the printed circuit board of FIG. 1.

Referring now to FIG. 2, there is illustrated an isometric view of the stencil and the printed circuit board of FIG. 1. Stencil 16 is a thin sheet of stainless steel with apertures or openings 21 that are cut to match the image of the component pads on a corresponding printed circuit board, such as printed circuit board 11. Stencil 16 is mounted within a screen-printing equipment, such as screen printer 10 as shown FIG. 1.

After printed circuit board 11 has been aligned with the stencil image on stencil 16, solder paste is then applied to the top side of stencil 16. Solder paste is preferably comprised of fine particles of tin/lead solder held together with a flux mixture. Subsequently, squeegee blade 13 is moved across stencil 16 at an angle θ. As squeegee blade 13 moves across stencil 16, the solder paste is pushed through openings 21 of stencil 16 and deposited onto pads 22 of printed circuit board 11. After an appropriate amount of solder paste has been deposited onto pads 22, electronic components, such as TCP devices, are then placed on the wet solder paste. Finally, heat is applied to the specific locations of printed circuit board 11 until the solder paste melts and eventually cools to form solid solder joints.

Referring back to FIG. 1, the process of applying the solder paste with a squeegee blade may tend to force a small amount of solder paste between the stencil 16 and a printed circuit board. Typically, solder paste may become deposited on the side of the stencil 16 that comes into contact with a printed circuit board. The result is that the pattern will no longer be limited to the openings in the stencil 16. In order to assure that the pattern produced is limited to the openings in the stencil 16, a cleaning mechanism 100 is provided. The cleaning mechanism includes a supply portion 110 and a take up portion 112. The supply portion 110 includes a universal shaft 130 that carries a clean roll of a lint free cleaning paper 120. The take up portion 112 includes another universal shaft 130 that carries a used portion of the roll of a lint free cleaning paper 120. The supply portion 110 and the take up portion 112 move the cleaning paper 120 over the surface of the stencil 16 which comes into contact with the printed circuit board or other electrical component being printed to. Cleaning fluid (not shown) is also applied as the cleaning paper is moved over the surface of the stencil 16 which comes into contact with the printed circuit board. This removes any solder paste that may have been squeegeed into the space between the stencil and the electrical component during the printing operation. The cleaning mechanism may be operated manually or automatically after a selected interval or number of printings.

Figure 3:
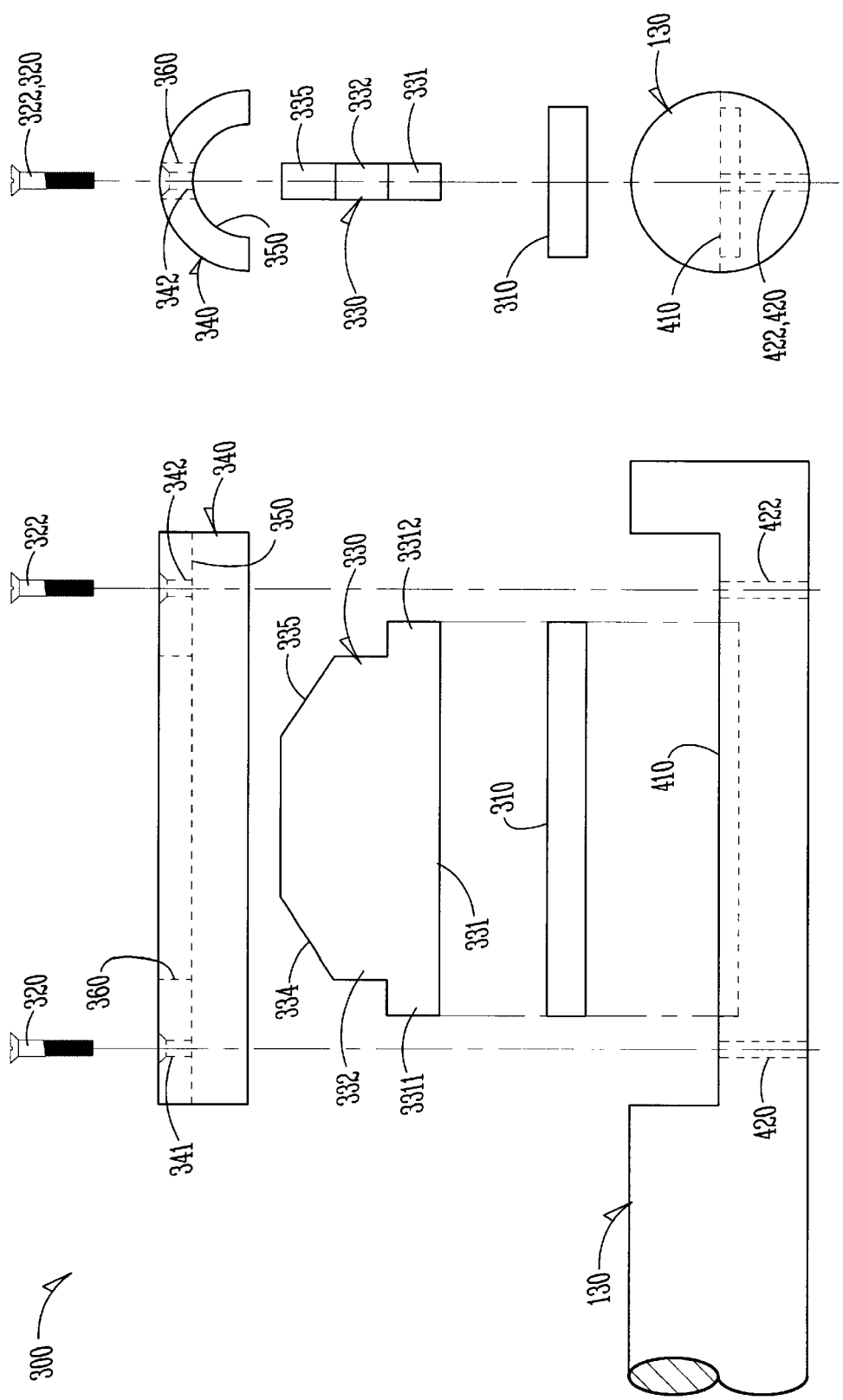
FIG. 3 is an exploded elevation view of the clamping mechanism of one end of a universal shaft for a screen printing machine.
Figure 4:
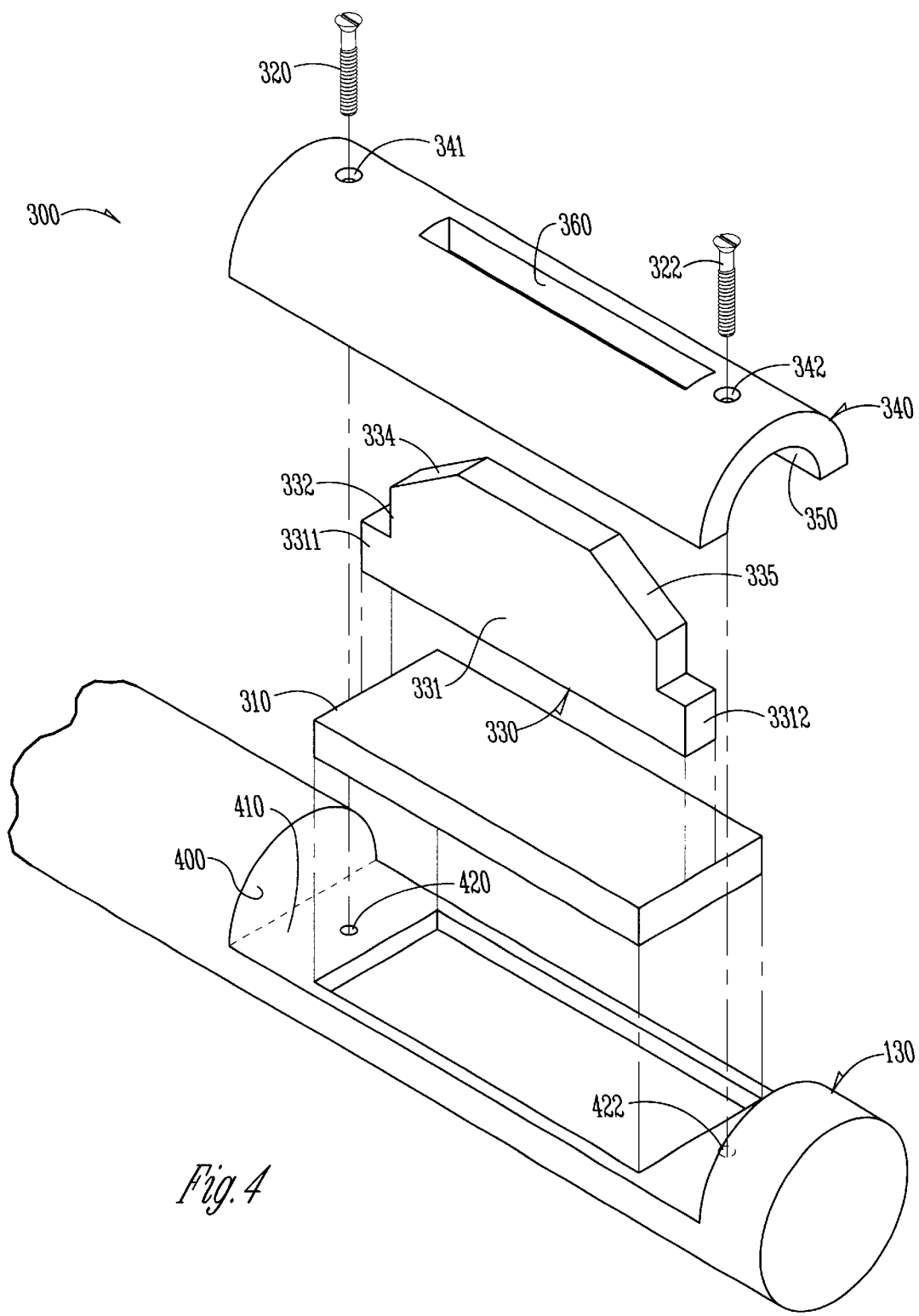
FIG. 4 is an exploded isometric view of the clamping mechanism on one end of a universal shaft for a screen printing machine.

Now referring to FIGS. 3 and 4, the assembly of the universal shaft 130 will now be discussed. FIG. 3 is an exploded elevation view of the clamping mechanism 300 of one end of a universal shaft 130 for a screen printing machine 10. FIG. 4 is an exploded isometric view of the clamping mechanism 300 on one end of a universal shaft 130 for a screen printing machine 10.

A universal shaft 130 is used for both of the supply shaft 110 as well as the take up shaft 112, as shown in FIG. 1. FIGS. 3 and 4 show the elements comprising the universal shaft 130. The universal shaft 130 has an opening 400 therein. The opening 400 includes an essentially flat surface 410 machined into the shaft 130. The flat surface 410 includes at least one threaded opening 420. As shown in FIG. 4, the flat surface 410 includes a pair of threaded openings 420, 422. A clamping mechanism 300 is placed into the opening 400 in the shaft 130. The clamping mechanism 300 includes a spring element 310, a protrusion member 330, and a cover 340. The spring member 310, as shown in FIGS. 3 and 4, is an elastomeric sheet of material that is placed on the flat surface 410 of the opening 400. A protrusion member 330 is placed on the spring element 310 such as the elastomeric sheet shown. The protrusion member includes a first portion 331 which has a first shoulder 3311, and a second should 3312. The protrusion member 330 also has a second portion 332 which has chamfered ends 334 and 335.

Also included is a cover 340 which is curved to approximately the same circumferential radius as the universal shaft 130. The cover 340 has inside surface 350 and a slot 360. The slot 360 is adapted to the protrusion. The slot 360 in the cover 340 is dimensioned to allow the protrusion member to pass through the slot. The cover 340 also includes a pair of openings 341 and 342, which are positioned to align with the openings 420 and 422, respectively, in the flat surface 410 of the opening 400 in the universal shaft. A pair of threaded fasteners 320 and 322 are used to fasten the cover 340 to the flat surface 410 of the opening 400 in the universal shaft 130. The threaded fasteners 320 and 322 thread into threaded openings 420 and 422, respectively, to hold the cover in place.

When assembled, the spring member 310 is sandwiched between the flat surface 410 of the opening 400 and a bottom surface of the first portion 331 of the protrusion member 330. The shoulders 3311 and 3312 abut an inner surface 350 of the cover 340. The amount of force produced by the protrusion member 330 as it extends outside the opening 360 in the cover 340 can be adjusted by varying the amount of threaded portion which is threaded into the openings 422 and 420 by the fasteners 322 and 320, respectively. Thus, by turning the screws so that they thread further into the openings 420 and 422, the amount of compression of the spring element 310 can be modified. In other words, if you tighten the threaded fasteners 320, 322, the spring element 310 such as the elastic sheet shown in FIGS. 3 and 4 will be further compressed. This will limit the amount of motion that the protrusion member 330 can move and will also produce a stronger spring constant at the end of the second portion 332 of the protrusion member. It should be noted that the invention can be modified in several different ways in order to vary the amount of force produced by the protrusion member 330 as it extends outside the opening 360 of the cover 340. For example, the thickness of the spring member 310 or elastic sheet shown can be varied. In addition, the derometer rating of the elastomeric sheet shown can also be varied by substituting different elastomeric substances for the elastic sheet. Some substances, of course, will have higher spring constants than other substances. In other words, a harder derometer rating rubber will be more difficult to compress and will be compressible only with a larger amount of force seen at the second portion 332 of the protrusion member. It should be noted that the design can be varied in any number of ways to produce different preferred embodiments of this invention. For example, the size of the opening 400 in the universal shaft 130 can be elongated and the protrusion member 330 can also be elongated if it is desirable to place the same amount of force across a larger area. In addition, the protrusion member 330 can also be thickened or made into a thicker dimension.

Figure 5:
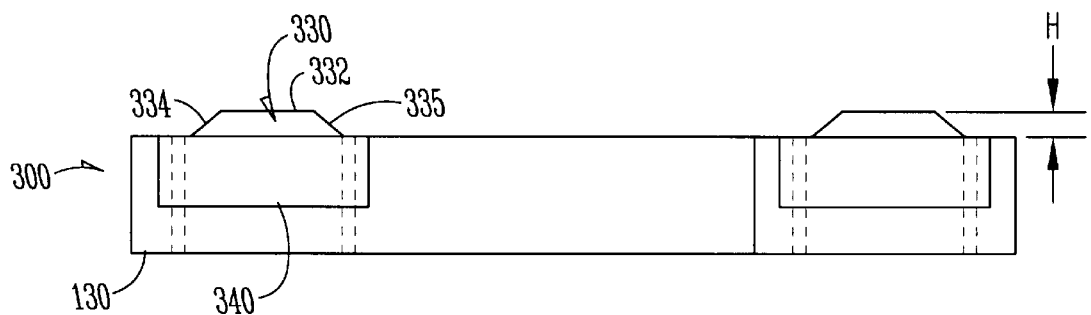
FIG. 5 is an elevation view of the universal shaft for a screen printing machine having a clamping mechanism positioned at each end.

FIG. 5 is an elevational view of a universal shaft 130 for a screen printing machine 10, which has a clamping mechanism 300 positioned at each end of the universal shaft. As shown in FIG. 5, the cover 340 is in place over the opening 400 in the universal shaft 130. The second portion 332 of the protrusion element 330 extends out from the circumference of the universal shaft a distance H, as shown in FIG. 5. The first portion 331 is contained within the covered opening 400 of the universal shaft 130. As shown in FIG. 5, the chamfered edges 334 and 335 of the second portion 332 extend beyond the circumference of the universal shaft 130.

Figure 6:
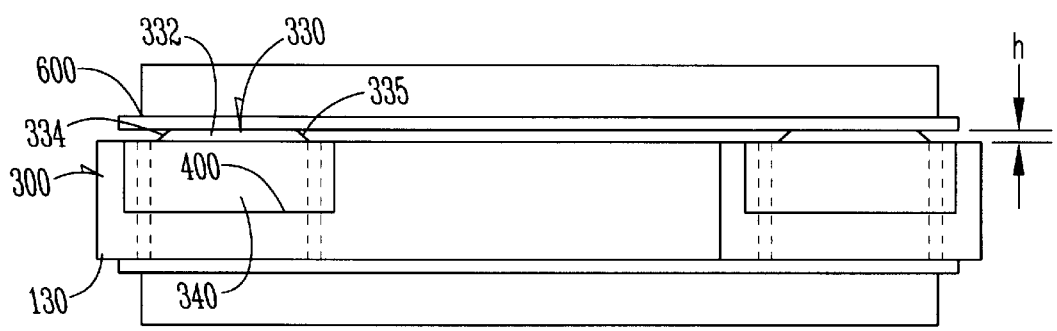
FIG. 6 is an elevation view of the universal shaft for a screen printing machine with a roll of cleaning paper attached thereto.

FIG. 6 is an elevational view of the universal shaft for a screen printing machine 10 loaded with a roll of cleaning paper 600. Again, the second portion 332 of the protrusion element 330 is shown in FIG. 6. Loading the roll 600 of wiping paper onto the shaft moves the protrusion member 330 so that it compresses the spring element 310, or in this case, an elastic sheet. The elastic sheet or elastomeric material produces a counteracting force similar to a spring. In other words, the amount of force produced by the protrusion member is proportional or related to the distance that the spring element 310 is compressed. The force produced clamps the roll of cleaning paper 600 to the universal shaft 130. As shown in FIG. 6, the second portion 332 of the protrusion member 330 extends a distance h beyond the circumference of the universal shaft 130. The difference between the position of the protrusion member 330 in an unloaded condition versus a loaded condition is equal to H minus h. The actual difference H minus h is equal to the distance that the elastic member or spring element 310 is compressed by loading a sheet of cleaning paper 600 onto the universal shaft 130. It should be noted that the chamfered edges 334 and 335 on the second portion 332 of the protrusion member 330 enables the sliding of the roll 600 on to and off of the universal shaft 130. In other words, the chamfered edges allow for the inside of the roll 600 of cleaning paper to slide with respect to the protrusion member 330. It should be noted that the number of clamping mechanisms 330 placed onto the universal shaft is selected so that the force produced by the protrusion members 330 is sufficient to hold or substantially hold the roll 600 of cleaning paper in fixed relation with respect to the universal shaft 130 when mounted thereon.

Figure 7:
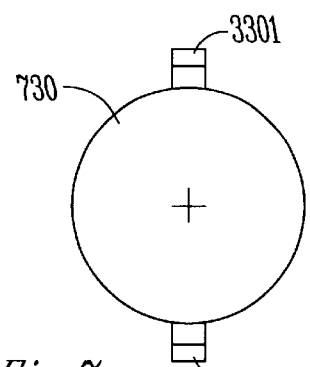
FIG. 7 is an end view of another preferred embodiment of the universal shaft for a screen printing machine.

FIG. 7 is an end view of another preferred embodiment of a universal shaft 730 for a screen printing machine 10. In this particular embodiment, the clamping mechanism used is essentially the same. As a result, the description of the clamping mechanism will not be repeated here. On universal shaft 730, the clamping mechanisms are placed in opposition to one another or 180 degrees away from one another. This allows for mounting of a roll of paper (shown in FIG. 6) to the universal shaft so that it remains substantially centered on the shaft. In other words, protrusion members 330 and 3301 and protrusion member 3302 are opposite one another so that the roll of paper remains centered with respect to the center of the universal shaft 730. Such an arrangement may be needed if eccentricity must be prevented.

Figure 8:
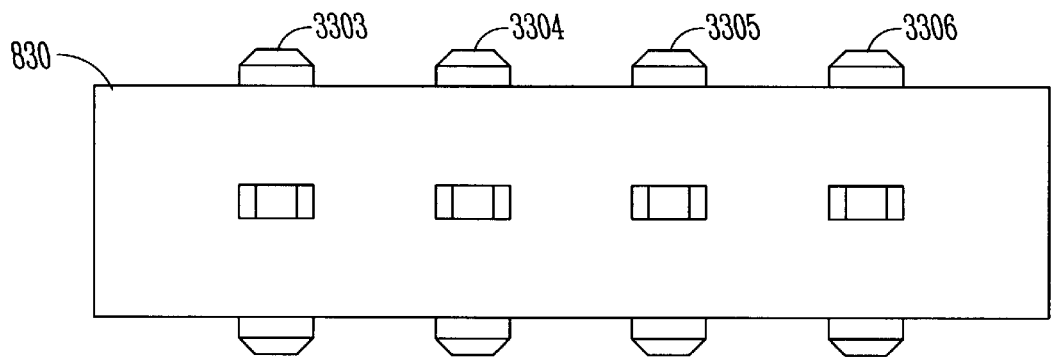
FIG. 8 is an elevation view of another preferred embodiment of the universal shaft for a screen printing machine.

FIG. 8 is an elevation view of another preferred embodiment of a universal shaft 830 for a screen printing machine 10. In this particular embodiment, a number of different clamping mechanisms are placed all along the body of the universal shaft 830. In essence, a number of shortened protrusion members 3303, 3304, 3305, and 3306 are aligned along a line parallel to the center axis of the universal shaft 830. Similar lines of clamping members are placed at various angles with respect to each of the lines on the surface of the universal shaft 830. As shown, each line of clamping members 3303, 3304, 3305, and 3306 is 90 degrees offset from the previous line of clamping members. In other words, there are four sets of four clamping members positioned about the radial portion of the cylinder comprising the universal shaft 830 shown in FIG. 8.

Figure 9:
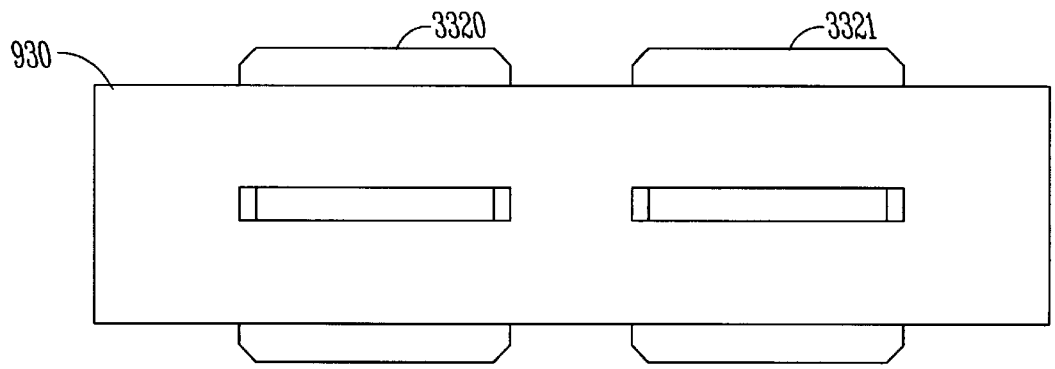
FIG. 9 is an elevation view of another preferred embodiment of the universal shaft for a screen printing machine.

FIG. 9 shows yet another elevational view of yet another preferred embodiment of a universal shaft 930. In this particular embodiment, an elongated protrusion member 3320 and 3321 are used at two ends of the universal shaft 930. These are placed in rows along lines that are parallel to the center line of the universal shaft 930. As shown in FIG. 9, four rows spaced 90 degrees away from each other are used to form the clamping member with respect to the universal shaft 930. It should be noted that the arrangements of the clamping members need not necessarily be in rows, or if they are in rows, they can be at any angular offset from the previous row of clamping members. All of these particular inventions are contemplated as being within the scope of the invention as described.

FIG. 10 shows another arrangement of a clamping member 1000. The clamping mechanism 1000 is very similar to the clamping mechanism 300 described in FIG. 3. The difference is that the spring element 310 has been replaced by actual springs 1010, 1011, 1012, and 1013. Of course, all the springs 1010, 1011, 1012, 1013 must be substantially the same length as well as have substantially the same spring constant. Depressions in the flat portion 410 of the opening 400 in the universal shaft 130 may be provided to receive one end of the springs. Similar depressions may be provided in the protrusion member or element 330 to receive the other end of the springs 1010, 1011, 1012, and 1013.

CONCLUSION

A cleaning element for a solder paste printing machine includes a shaft with an opening therein. Positioned within the opening is a protrusion element. A spring element is also positioned within the opening. The protrusion element further includes a first portion which fits within the opening of the shaft, and a second portion which extends beyond the opening in the shaft. At least a portion of the spring element is sandwiched between the opening in the shaft and the first portion of the protrusion element. Also included is a cover for covering the shaft. The cover has a slot which allows the second portion of the protrusion element to extend beyond the main body of the shaft. The cleaning element may also include a fastener having a threaded end and an upset end. The opening in the shaft also has at least one threaded opening and the cover has a corresponding opening therein for receiving the upset end of the fastener. The amount of pressure produced by the second portion of the protrusion element can be adjusted by adjusting the distance that the fastener is threaded into the threaded opening in the shaft. The second end of the protrusion element includes at least one beveled edge and may have at least two beveled edges. In some embodiments, the spring element is an elastomeric material the thickness of which can be varied to vary the amount of force produced by the protrusion element. In addition, the spring constant of the spring element can be varied to vary the amount of force produced by the protrusion element. In some embodiments, the protrusion element is made of metal. In addition, the shaft can include a second opening therein with a second protrusion element, a second spring element positioned within the second opening. The second protrusion element further includes a first portion which fits within the second opening of the shaft, and a second portion which extends beyond the second opening in the shaft. At least a portion of the second spring element is sandwiched between the second opening in the shaft and the first portion of the second metal protrusion element. A second cover for covering the shaft is also provided. The cover has a slot therein to allow the second portion of the second protrusion element to extend beyond the main body of the shaft.

In another embodiment, the shaft of the cleaning element for a solder paste printing machine includes a plurality of openings. The cleaning element has a plurality of protrusion elements positioned within the plurality of openings in the shaft.

A solder paste printing machine includes a print head, a screen, and a screen cleaning element. The screen cleaning element includes a first shaft having unused cleaning paper thereon, and a second shaft having used cleaning paper thereon. Each of the first shaft and the second shaft have an opening therein. Each of the first shaft and the second shaft further include a protrusion element and a spring element positioned within the opening in the shaft. Each protrusion element includes a first portion which fits within the opening of the shaft, and a second portion which extends beyond the circumference of the shaft. At least a portion of the spring element is sandwiched between the opening in the shaft and the first portion of the protrusion element. Also included is a first cover for covering the opening in the first shaft and a second cover for covering the opening in the second shaft, the first cover having a slot therein to allow the second portion of the protrusion element to extend beyond the circumference of the first shaft. The second cover also has a slot therein to allow the second portion of the protrusion element to extend beyond the circumference of the second shaft. The solder paste printing machine also includes an adjustment mechanism associated with each of the first second and the second shaft for adjusting the amount of force produced by the protrusion element associated with each of the first shaft and the second shaft. In some embodiments, the adjustment mechanism associated with each of the first shaft and the second shaft includes a fastener having a threaded end. In this embodiment, the opening in each of the first shaft and the second shaft has at least one threaded opening therein. The amount of pressure produced by the second portion of the protrusion element can be adjusted by adjusting the distance that the fastener is threaded into the threaded opening in the first shaft and the second shaft.

The second end of each of the protrusion elements associated with the first shaft and the second shaft includes at least one beveled edge or may have at least two beveled edges. The spring elements associated with the first shaft and the second shaft include an elastomeric material. In some embodiments, at least one of the first shaft and the second shaft has a plurality of protrusion elements. The number of protrusion elements used is related to the force needed to hold a roll of cleaning paper onto the shaft such that there is limited movement between the shaft and the roll of cleaning paper.

Most generally speaking, a cleaning element for a solder paste printing machine includes a shaft, and a device for securing a plurality of different types of rolls of cleaning paper to the shaft.

Advantageously, the method and apparatus for cleaning heads described uses a single type of cleaning paper for more than one type or model of PCB printing head and printing screen. Although, one single type of cleaning paper might not be able to be used throughout a PCB assembly house, this has the advantage of lessening the amount of inventory of cleaning paper needed to be carried to use in all the PCB printing machines used in one PCB assembly house. This also simplifies the inventory ordering process, as less types of cleaning paper need to be ordered. In addition, a PCB assembly house can also obtain volume pricing on cleaning paper since more of one type of paper can be ordered for each PCB printing machine. The process and apparatus can be used to more uniformly clean the screens on PCB printers since there will be less types of cleaning paper used or even a single type of cleaning paper used. By making the process more uniform, the process can be more closely controlled and any process errors that may occur due to cleaning errors can be more quickly isolated and corrected. The apparatus can be adapted for use on all types of heads for all types of printing machines used within a PCB assembly plant. The invention also lessens the sources of contaminates that could potentially be introduced into the printing process.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A screen printing machine for installing solder to a circuit board, comprising:

a print head;

a screen; and a screen cleaning element further comprising:

a shaft having an opening therein;

a protrusion element;

a spring element positioned within the opening of the shaft, the protrusion element further comprising:

a first portion which fits within the opening of the shaft; and a second portion which extends beyond the circumference of the shaft, at least a portion of the spring element being sandwiched between the opening in the shaft and the first portion of the protrusion element, and a cover for covering the opening of the shaft, the cover having a slot therein to allow the second portion of the protrusion element to extend beyond the main body of the shaft.

2. The screen printing machine of claim 1 further comprising:
   a second opening in the shaft; and
   a second cover for covering the second opening in the shaft, the second cover having a slot therein to allow the second portion of the protrusion element to extend beyond the circumference of the shaft.

3. The screen printing machine of claim 1 further comprising an adjustment mechanism associated with the shaft for adjusting the amount of force produced by the protrusion element.

4. The screen printing machine of claim 3 wherein the adjustment mechanism includes a fastener having a threaded end, wherein the opening has at least one threaded opening therein, wherein the amount of force produced by the second portion of the protrusion element can be adjusted by adjusting the distance that the fastener is threaded into the threaded opening.

5. The screen printing machine of claim 1 wherein the second portion of the protrusion element includes at least one beveled edge.

6. The screen printing machine of claim 1 wherein the second portion of the protrusion element includes at least two beveled edges.

7. The screen printing machine of claim 1 wherein the spring element is an elastomeric material.

8. The screen printing machine of claim 1 wherein the shaft has a plurality of protrusion elements, wherein the number of protrusion elements used is related to the force needed to hold a roll of cleaning paper onto the shaft such that there is limited movement between the shaft and the roll of cleaning paper.

9. A cleaning element for a screen printing machine for installing solder to a circuit board, comprising:
   a shaft having an opening therein;
   a protrusion element;
   a spring element positioned within the opening, the protrusion element further comprising:
      a first portion which fits within the opening of the shaft; and
      a second portion which extends beyond the opening in the shaft, at least a portion of the spring element being sandwiched between the opening in the shaft and the first portion of the protrusion element; and
   a cover for covering the opening of the shaft, the cover having a slot therein to allow
      the second portion of the protrusion element to extend beyond the main body of the shaft.

10. The cleaning element of claim 9 further comprising a fastener having a threaded end and an upset end, wherein the opening in the shaft has at least one threaded opening therein and wherein the cover has an opening therein for receiving the upset end of the fastener.

11. The cleaning element of claim 10 wherein the amount of pressure produced by the second portion of the protrusion element can be adjusted by adjusting the distance that the fastener is threaded into the threaded opening in the shaft.

12. The cleaning element of claim 9 wherein the second portion of the protrusion element includes at least one beveled edge.

13. The cleaning element of claim 9 wherein the second portion of the protrusion element includes at least two beveled edges.

14. The cleaning element of claim 9 wherein the spring element is an elastomeric material.

15. The cleaning element of claim 14 wherein the thickness of the elastomeric material can be varied to vary the amount of force produced by the protrusion element.

16. The cleaning element of claim 15 wherein the spring constant of the spring element can be varied to vary the amount of force produced by the protrusion element.

17. The cleaning element of claim 9 wherein the protrusion element is made of metal.

18. The cleaning element of claim 9 wherein the shaft includes a second opening therein, the cleaning element further comprising:
   a second protrusion element;
   a second spring element positioned within the second opening, the second protrusion element further comprising:
      a first portion which fits within the second opening of the shaft; and
      a second portion which extends beyond the second opening in the shaft, at least a portion of the second spring element being sandwiched between the second opening in the shaft and the first portion of the second protrusion element; and
   a second cover for covering the second opening of the shaft, the cover having a slot therein to allow the second portion of the second protrusion element to extend beyond the main body of the shaft.

19. The cleaning element of claim 9 wherein the shaft includes a plurality of openings therein, the cleaning element further comprising a plurality of protrusion elements positioned within the plurality of openings in the shaft.

* * * * *